(12) United States Patent
Lee et al.

(10) Patent No.: US 10,098,232 B2
(45) Date of Patent: Oct. 9, 2018

(54) EMBEDDED BOARD AND METHOD OF MANUFACTURING THE SAME

(71) Applicant: Samsung Electro-Mechanics Co., Ltd., Suwon-si (KR)

(72) Inventors: Joon-Sung Lee, Seoul (KR); Yong-Sam Lee, Yongin-si (KR); Seok-Hwan Ahn, Seongnam-si (KR); Jae-Hoon Choi, Yongin-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 80 days.

(21) Appl. No.: 14/990,046

(22) Filed: Jan. 7, 2016

(65) Prior Publication Data

US 2016/0219709 A1    Jul. 28, 2016

(30) Foreign Application Priority Data

Jan. 22, 2015 (KR) ........................ 10-2015-0010699

(51) Int. Cl.
| | |
|---|---|
| H05K 1/18 | (2006.01) |
| H05K 3/28 | (2006.01) |
| H05K 3/46 | (2006.01) |
| H05K 1/11 | (2006.01) |

(52) U.S. Cl.
CPC ............ *H05K 1/186* (2013.01); *H05K 3/284* (2013.01); *H01L 2224/16225* (2013.01); *H01L 2224/32225* (2013.01); *H01L 2224/73204* (2013.01); *H01L 2924/15311* (2013.01); *H05K 1/113* (2013.01); *H05K 1/185* (2013.01); *H05K 3/4697* (2013.01); *H05K 2201/10* (2013.01); *H05K 2201/10015* (2013.01); *H05K 2201/10636* (2013.01); *Y02P 70/611* (2015.11)

(58) Field of Classification Search
CPC .......................... H05K 1/185; H05K 2201/10
USPC .................................................. 361/761-764
See application file for complete search history.

(56) References Cited

U.S. PATENT DOCUMENTS

| | | | | |
|---|---|---|---|---|
| 7,208,832 B2* | 4/2007 | Yamagata | ......... | H01L 23/49816 257/701 |
| 2008/0291649 A1* | 11/2008 | Mashino | ................ | H01G 4/236 361/763 |
| 2010/0002406 A1* | 1/2010 | Hsu | ................... | H01L 23/49822 361/764 |
| 2012/0273960 A1* | 11/2012 | Park | .................... | H01L 21/4846 257/774 |

\* cited by examiner

*Primary Examiner* — Binh Tran
(74) *Attorney, Agent, or Firm* — NSIP Law

(57) ABSTRACT

Disclosed is an embedded board and a method of manufacturing the same. The embedded board may include an insulating layer a first circuit layer formed inside the insulating layer a second circuit layer formed on an upper part of the first circuit layer, and the second circuit layer being disposed inside the insulating layer, a first electronic element arranged inside the insulating layer, the first electronic element being spaced apart from the second circuit layer, a metal pillar formed between the first circuit layer and the second circuit layer or the first electronic element, and a first via formed on the upper part of the second circuit layer inside the insulating layer.

13 Claims, 11 Drawing Sheets

EMBEDDED BOARD AND METHOD OF MANUFACTURING THE SAME

CROSS REFERENCE TO RELATED APPLICATION(S)

This application claims the benefit under 35 USC § 119(a) of Korean Patent Application No. 10-2015-0010699, filed on Jan. 22, 2015 in the Korean Intellectual Property Office, the entire disclosure of which is incorporated herein by reference for all purposes.

BACKGROUND

1. Field

The following description relates to an embedded board and a method of manufacturing the same.

2. Description of Related Art

With the increased demand for multi-functional, small and thin mobile devices, technology for embedding electronic components, such as, ICs, semiconductor chips, active devices, and passive devices, into a substrate is needed. Recently, technologies for embedding components into the substrate by various methods have been developed.

According to the general component embedded board, a cavity is formed into an insulating layer of the board and electronic components, such as various devices, ICs, and semiconductor chips are embedded into the cavity. An adhesive resin, such as prepreg, is applied inside the cavity and on an insulating layer into which the electronic components are embedded. The electronic components are fixed and the insulating layer is formed, by applying the adhesive resin.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an embedded board and a method of manufacturing the same which is able to improve flowability of a molding material.

In another general aspect, there is provided an embedded board and a method of manufacturing the same which is able to reduce short-circuits caused by misalignment.

In another general aspect, there is provided an embedded board including an insulating layer, a first circuit layer formed inside the insulating layer, a second circuit layer formed on an upper part of the first circuit layer, and the second circuit layer being disposed inside the insulating layer, a first electronic element arranged inside the insulating layer, the first electronic element being spaced apart from the second circuit layer, a metal pillar formed between the first circuit layer and the second circuit layer or the first electronic element, and a first via formed on an upper part of the second circuit layer inside the insulating layer.

A lower surface of the first circuit layer and an upper surface of the first via may be exposed to the outside.

The lower surface of the first circuit layer may be on a same line as a lower surface of the insulating layer.

The upper surface of the first via may be on a same line as an upper surface of the insulating layer.

The metal pillar may be configured to electrically connect the first circuit layer with at least one of the second circuit layer or the first electronic element.

The embedded board may include an adhesive formed between the metal pillar and the first electronic element.

The adhesive may be configured to electrically connect the metal pillar and the first electronic element.

The embedded board may include a second via formed on an upper part of the first electronic element, the second via may be located inside the insulating layer, and the second via may be electrically connected with the first electronic element.

An upper surface of the second via may be exposed to the outside.

The embedded board may include protecting layers formed on an upper surface and a lower surface of the insulating layer.

The embedded board may include a second electronic element mounted on at least one of an upper part or a lower part of the insulating layer.

The embedded board may include an underfill resin formed between the second electronic element and the insulating layer.

In another general aspect, there is provided a method for manufacturing an embedded board including forming a first circuit layer on a carrier board, forming metal pillars on an upper part of the first circuit layer, forming a first insulating layer to expose an upper surface of each of the metal pillars by embedding the first circuit layer and the metal pillars in the first insulating layer, forming a second circuit layer on an upper part of at least one of the metal pillars, arranging a first electronic element on at least one of the upper surface of the metal pillars that are exposed to the outside, forming a second insulating layer to embed the second circuit layer and the first electronic element, forming a first via on an upper part of the second circuit layer to pass through the second insulating layer, and eliminating the carrier board.

The forming of the first insulating layer may include forming the first insulating layer to embed the first circuit layer and the metal pillars, and polishing the first insulating layer to expose the upper surface of the metal pillars to the outside.

The method may include forming an adhesive on the upper part of some of the metal pillars that are exposed to the outside prior to the arranging of the first electronic element.

The adhesive may be a conductive material.

The forming of the first via may include forming a second via on the upper part of the first electronic element to pass through the second insulating layer.

The method of claim 13, further including forming a metal layer on an upper surface of the second insulating layer.

The method may include eliminating a portion of the metal layer to expose the upper surface of the first via to the outside.

The method may include forming a protecting layer on a lower part of the first insulating layer and on an upper part of the second insulating layer after the eliminating of the carrier board.

The method may include mounting a second electronic element on at least one of the lower part of the first insulating layer or the upper part of the second insulating layer after the forming of the protecting layer.

The method may include forming an underfill resin between the second electronic element and at least one of the first insulating layer or the second insulating layer after the forming of the second electronic element.

Other features and aspects will be apparent from the following detailed description, the drawings, and the claims.

Figure 1:
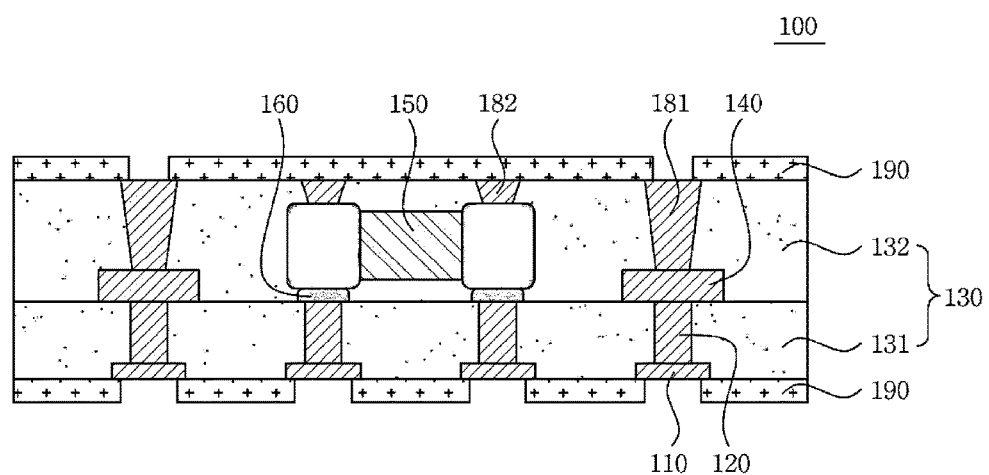
FIG. 1 is a diagram illustrating an example of an embedded board.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations is described as an example; the sequence of operations is not limited to that set forth herein and may be changed as is known in the art, with the exception of steps and/or operations that necessarily occur in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

FIG. 1 is an diagram illustrating an example of an embedded board. Referring to FIG. 1, an embedded board 100 may include an insulating layer 130, a first circuit layer 110, a metal pillar 120, a second circuit layer 140, a first via 181, a first electronic element 150, a second via 182, and a protecting layer 190. The insulating layer 130 may include a first insulating layer 131 and a second insulating layer 132.

The second insulating layer 132 may be formed on the upper part of the first insulating layer 131.

The first insulating layer 131 and the second insulating layer 132 may be composed of a composite polymer resin which is sometimes used as an interlayer insulating material. For example, the first insulating layer 131 and the second insulating layer 132 may be formed of an epoxy-based resin such as, for example, prepreg, ajinomoto build-up film (ABF), FR-4, and bismaleimide triazine (BT). Other epoxy-based resin are considered to be well within the scope of the present disclosure. The first insulating layer 131 and the second insulating layer 132 may be formed of an insulating material chosen from insulating materials known in the field of circuit boards.

According to an example, the first circuit layer 110 may be formed inside the first insulating layer 131. The first circuit layer 110 may be formed on the lower surface of the first insulating layer 131 and the lower surface of the first circuit layer 110 may be exposed to the outside. In an example, the lower surface of the first circuit layer 110 may be arranged to be on the same line as the lower surface of the first insulating layer 131.

According to an example, the first circuit layer 110 may be formed of any conductive material, which is usually used in the field of circuit boards such as, for example, copper, but it may not be limited thereto.

According to an example, the metal pillar 120 may be formed on the upper part of the first circuit layer 110, and be disposed inside the first insulating layer 131. The metal pillar 120 may be formed to pass through the first insulating layer 131. The metal pillar 120 may adhere to and be electrically connected to the first circuit layer 110.

According to an example, the metal pillar 120 may be formed of any conductive material, which is usually used in the field of circuit boards such as, for example, copper, but it may not be limited thereto.

According to an example, the second circuit layer 140 may be formed on the upper part of the first insulating layer 131. The second circuit layer 140 may be embedded in the second insulating layer 132. The second circuit layer 140 may be formed on a portion of the upper part of the metal pillar 120. The second circuit layer 140 may adhere to and be electrically connected to the metal pillar 120. The first circuit layer 110 and the second circuit layer 140 formed on the upper part of the first circuit layer 110 may be electrically connected with each other through the metal pillar 120.

According to an example, the second circuit layer 140 may be formed to have a greater diameter than that of the upper surface of the metal pillar 120 and the lower surface of the first via 181. According to an example, the second circuit layer 140 may increase release of heat. As thickness of the second circuit layer 140 increases, the heat releasing performance may increase.

According to an example, the second circuit layer 140 may be formed of any conductive material that is used in the field of circuit boards. For example, the second circuit layer 140 may be formed of a conductor such as, for example, copper.

According to an example, the first via 181 may be formed on the upper part of the second circuit layer 140 inside the second insulating layer 132. The first via 181 may pass through the second insulating layer 132. The upper surface of the first via 181 may be exposed to the outside from the upper surface of the second insulating layer 132. For example, the upper surface of the first via 181 may be arranged on the same line with the upper surface of the second insulating layer 132. The first via 181 prepared as such may adhere to and be electrically connected with the second circuit layer 140.

According to an example, the first via 181 may be formed of any conductive material which is usually used in the field of circuit boards. For example, the first via 181 may be formed of a conductor such as, for example, copper.

According to an example, the first electronic element 150 may be spaced-apart from the side surface of the second circuit layer 140. The first electronic element 150 may be formed on the upper part of the metal pillar 120 to be electrically connected with the metal pillar 120. The first circuit layer 110 and the first electronic element 150 arranged on the upper part of the first circuit layer 110 may be electrically connected through the metal pillar 120. An adhesive 160 may be formed between the first electronic element 150 and the metal pillar 120. The adhesive 160 may be formed of any conductive material which is used in the field of circuit boards. When the metal pillar 120 and the first electronic element 150 are to be insulated from each other, the adhesive 160 may be formed of a non-conductive material such as, for example, an epoxy resin. An electrode of the first electronic element 150 may be in contact with the adhesive 160 or the metal pillar 120.

In an example, the first electronic element 150 may be a Multilayer Ceramic Capacitor (MLCC). In other examples, the first electronic element 150 may be any element, which can be mounted and embedded in a circuit board.

According to an example, the second via 182 may be formed on the upper part of the first electronic element 150, inside the second insulating layer 132. The second via 182 may pass through the second insulating layer 132. The second via 182 may adhere to and be electrically connected to the first electronic element 150. An electrode of the first electronic element 150 may adhere to the second via 182.

According to an example, the second via 182 may be formed of any conductive material which is usually used in the field of circuit boards. For example, the second via 182 may be formed of a conductor such as, for example, copper.

According to an example, the protecting layer 190 may be formed on the lower part of the first insulating layer 131 to protect the first circuit layer 110. The protecting layer 190 may be also formed on the upper part of the second insulating layer 132 to protect the first via 181 and the second via 182.

The protecting layer 190 according to an example may prevent a solder from coating the first circuit layer 110, the first via 181, and the second via 182, when soldering is performed to electrically connect with an external component. The protecting layer 190 may also prevent oxidation and corrosion of the first circuit layer 110, the first via 181, and the second via 182. In an example, the external component (not shown) may be a component, such as, for example, an electronic element or a board.

According to an example, the protecting layer 190 may be formed to expose a part that is electrically connected with the external component to the outside. For example, when any part of the first circuit layer 110, the first via 181, and the second via 182 is electrically connected with the external component, the protecting layer 190 may expose that part to the outside. For example, as shown in FIG. 1, the protecting layer 190 is shown to expose the first circuit layer 110 and the first via 181.

According to an example, the protecting layer 190 may be formed of a heat-resistance covering material, such as, for example, a solder resist.

According to an example, the protecting layer 190 may be selectively formed.

According to an example, the embedded board 100 may be formed to embed the first circuit layer 110 in the first insulating layer 131, and the first via 181 and the second via 182 in the second insulating layer 132. The first circuit layer 110, and the first via 181 and the second via 182 may be buried patterns. Thus, the embedded board 100 may have a thinner thickness compared to a conventional board having protruded patterns.

When the protecting layer 190 is formed, the upper surface of the protecting layer 190 may have a lower height than that formed on the board having protruded patterns. Thus, when an electronic element (not shown) is mounted on the upper part of the embedded board 100, a gap between the electronic element and the protecting layer 190 may be greater than the board having protruded patterns. After mounting the electronic element, a molding material may have better adhesion with the solder resist of the protecting layer 190, compared to copper. As the gap between the electronic element and the protecting layer 190 is smaller in the board having protruded patterns, the molding material may adhere to the protecting layer 190 better to cause void between the electronic element and the board. However, the embedded board 100 according to an example may have a greater gap between the protecting layer 190 and the electronic element due to the buried patterns, such that flowability of the molding material may be improved, compared to the board having protruded patterns.

Figure 2:
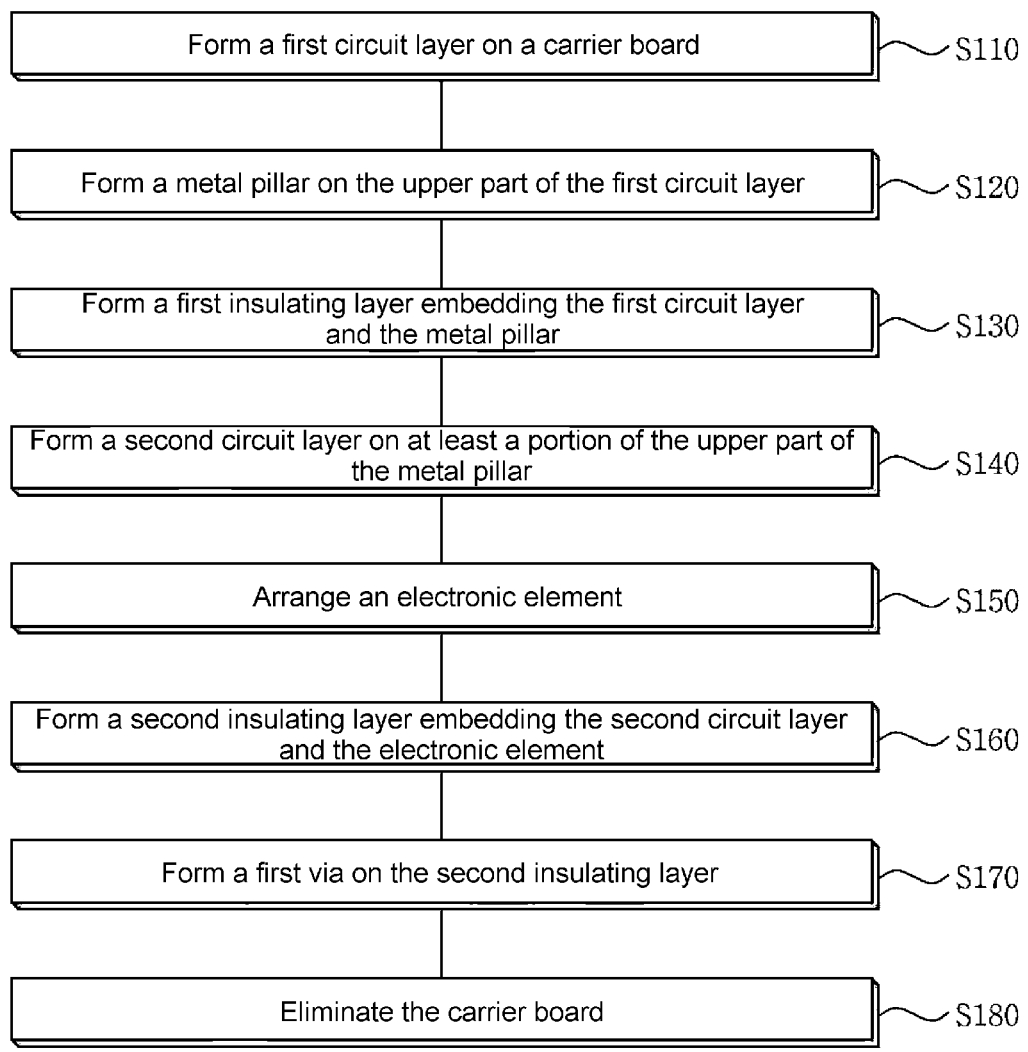
FIG. 2 is a diagram illustrating an example of a method for manufacturing an embedded board.

FIG. 2 is a diagram illustrating a method for manufacturing an embedded board. The operations in FIG. 2 may be performed in the sequence and manner as shown, although the order of some operations may be changed or some of the operations omitted without departing from the spirit and scope of the illustrative examples described. Many of the operations shown in FIG. 2 may be performed in parallel or concurrently. The above descriptions of FIG. 1, is also applicable to FIG. 2, and is incorporated herein by reference. Thus, the above description may not be repeated here. FIG. 3 to FIG. 17 are diagrams illustrating examples of a method for manufacturing an embedded board. A method for manufacturing an embedded board according to an example of FIG. 2 will be explained with reference to the examples illustrated in FIG. 3 to FIG. 17.

Figure 3:
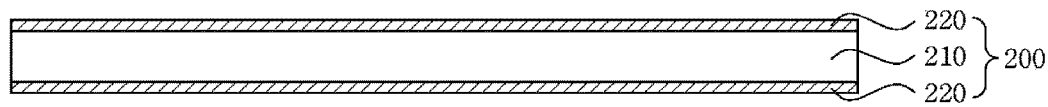
FIG. 3 to FIG. 17 are diagrams illustrating examples of a method for manufacturing an embedded board.

Referring to FIG. 3, a carrier board 200 may be prepared.

Figure 4:
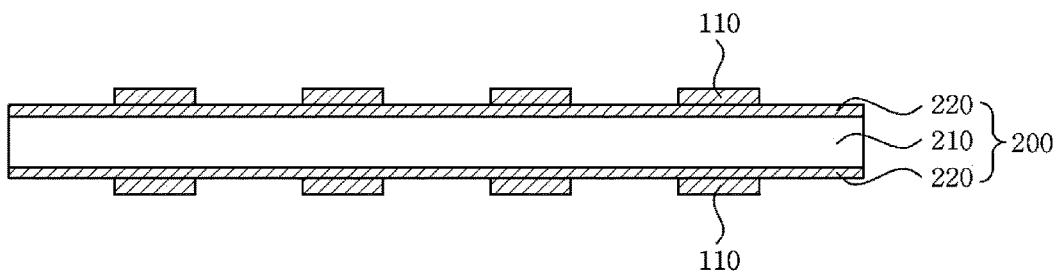

Referring to FIG. 3 and FIG. 4, in S110 of FIG. 2, a first circuit layer 110 may be formed on the carrier board 200.

The carrier board 200 supports an insulating layer and a circuit layer when they are formed on the embedded board.

The carrier board 200 may be a laminated structure including the carrier metal layer 220 on the upper surface and the lower surface of the carrier core 210.

The carrier core 210 may be formed of an insulating material, but it may not be limited thereto. The carrier core 210 may be a laminated structure having more than one layer of a metallic material or an insulating layer and a metal layer.

The carrier metal layer 220 may be formed of a conductor such as, for example, copper, but it may not be limited thereto. It may be formed of any conductive material which is used in the field of circuit boards.

The same process may be performed on the lower part of the carrier board 200 to provide an embedded board as that performed on the upper part of the carrier board 200. In the description of the method for manufacturing an embedded board, the process to be performed on upper part of the carrier board 200 will be explained. Since the process to be performed on the lower part of the carrier board 200 is the same as that performed on the upper part of the carrier board 200, the descriptions of the upper part of the carrier board 200, is also applicable to the lower part of the carrier board 200.

The carrier board 200 including the carrier core 210 and one layered carrier metal layer 220 formed on each of the upper surface and the lower surface of the carrier core 210 is illustrated and explained, but its structure may not be limited thereto. For example, the carrier board 200 may have 2-layred carrier metal layer 220 formed on each of the upper surface and the lower surface of the carrier core 210. In addition, the carrier board 200 may include a releasing layer (not shown) between the carrier metal layers 220 and then the carrier board 200 may be eliminated. As such, the carrier board 200 may be any kind, which is known in the art.

Referring to FIG. 4, a first circuit layer 110 may be formed. According to an example, the first circuit layer 110 may be formed on the carrier metal layer 220 of the carrier board 200.

According to an example, the first circuit layer 110 may be formed by a circuit pattern forming process which is used in the field of circuit boards such as, for example, a tenting process, a semi-additive process (SAP), and a modified semi-additive process (MSAP). The first circuit layer 110 may be formed of a conductive material such as, for example, Cu, but it may not be limited thereto. It may be any conductive material, which is used in the field of circuit boards.

Figure 5:
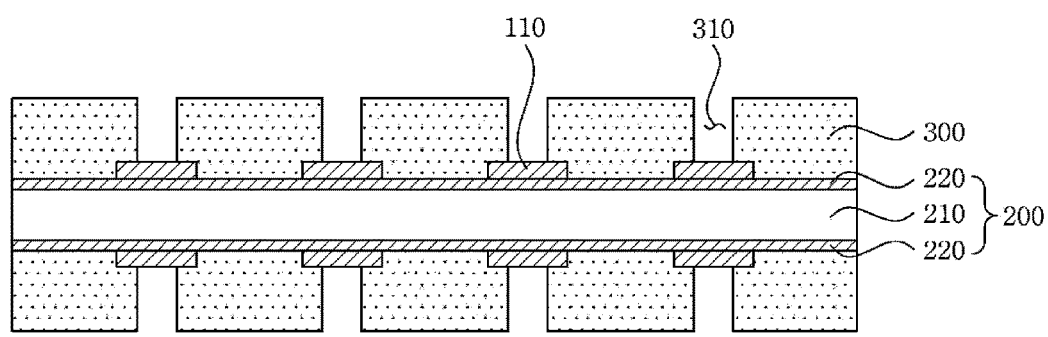
Figure 6:
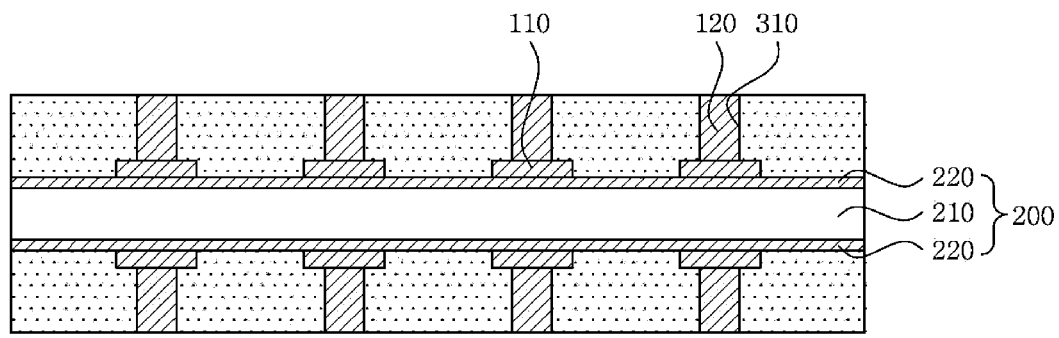
Figure 7:
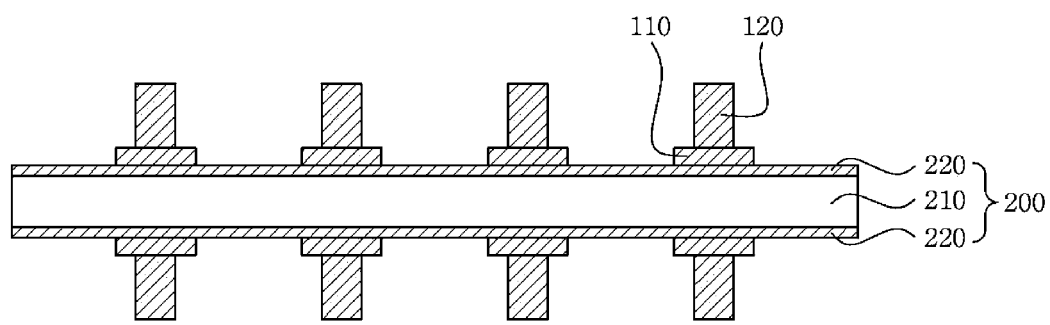

Referring to FIG. 5 to FIG. 7, in S120 of FIG. 2, a metal pillar 120 may be formed on the upper part of the first circuit layer 110. Referring to FIG. 5, a plating resist 300 may be formed. The plating resist 300 may be formed on the upper part of the carrier board 200 and the first circuit layer 110. The plating resist 300 may include a plating opening part 310 on the upper surface of the first circuit layer 110 to be exposed to the outside.

Referring to FIG. 6, a metal pillar 120 may be formed. An electro plating may be performed to the plating opening part 310 of the plating resist 300, so that the metal pillar 120 may be formed by filling a conductive material to the plating opening part 310.

The method for forming the metal pillar 120 may not be limited to the electro plating, any method that fills a conductive material to the plating opening part 310 may be used.

The metal pillar 120 may be formed of a conductive material, which is used in the field of circuit boards, such as, for example, copper. The metal pillar 120 may adhere to and and be electrically connected with the first circuit layer 110.

The metal pillar 120 may be formed on the first circuit layer 110 which is exposed to the outside, so that misalignment with the first circuit layer 110 may be prevented. Even if misalignment with the first circuit layer 110 is present, short-circuits may be reduced since a diameter of the first circuit layer 110 is greater than that of the metal pillar 120.

Referring to FIG. 7, the plating resist 300 may be eliminated.

Figure 8:
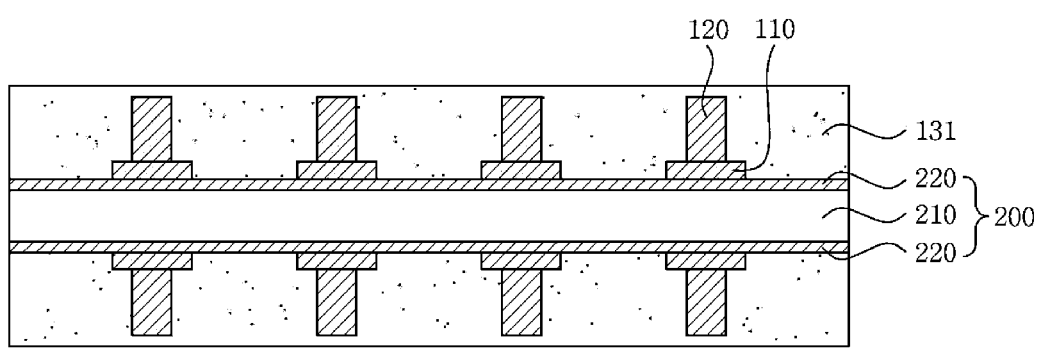
Figure 9:
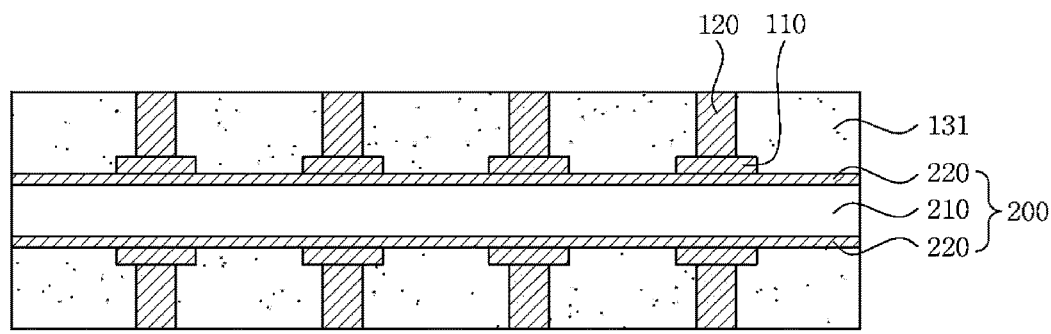

In S130 of FIG. 2, referring to FIG. 8 and FIG. 9, a first insulating layer 131 embedding the first circuit layer 110 and the metal pillar 120 may be formed.

The first insulating layer 131 may be formed on the upper surface of the carrier board 200 to embed the first circuit layer 110 and the metal pillar 120. The upper surface of first insulating layer 131 may be on the same line as the upper surface of the metal pillar 120. As shown in FIG. 8, in another example, the first insulating layer 131 may be formed to cover the metal pillar 120.

The first insulating layer 131 may be formed by laminating a film on the upper part of the carrier board 200 and then pressing and heating. In another example, the first insulating layer 131 may be formed by coating in a liquid type on the upper part of the carrier board 200. The method for forming the first insulating layer 131 may not be limited to the above mentioned methods and may be any method known in the art.

The first insulating layer 131 may be formed of a composite polymer resin which is usually used as an interlayer insulating material. For example, the first insulating layer 131 may be formed of an epoxy-based resin such as, for example, prepreg, ajinomoto build-up film (ABF), FR-4, and bismaleimide triazine (BT). The first insulating layer 131 may be formed of any insulating material known in the field of circuit boards.

Referring to FIG. 9, the first insulating layer 131 may be polished to expose the upper surface of the metal pillar 120 to the outside.

Figure 10:
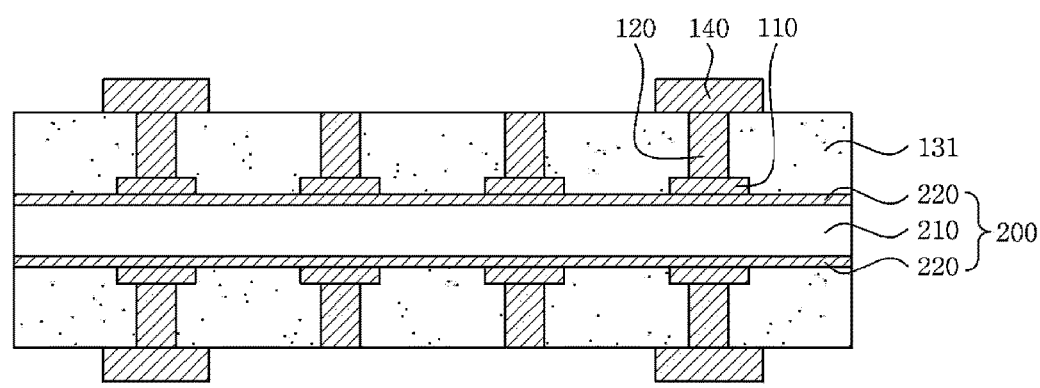

In S140 of FIG. 2, referring to FIG. 10, a second circuit layer 140 may be formed on a part of the upper part of the metal pillar 120.

Referring to FIG. 10, the second circuit layer 140 may be formed on one or more of the metal pillars 120 The second circuit layer 140 may be formed on the part where a first electronic element (not shown) is not formed. That is, the part where the second circuit layer 140 is not formed, the first electronic element (not shown) may be located later.

The second circuit layer 140 may be formed using any method for forming circuit patterns of circuit boards such as, for example, a tenting process, a semi-additive process (SAP), and a modified semi-additive process (MSAP). The second circuit layer 140 may be formed of a conductive material such as, for example, copper, but it may not be limited thereto. The second circuit layer 140 may be formed of any conductive material, which is usually used in the field of circuit boards.

The second circuit layer 140 may adhere to and be electrically connected with the metal pillar 120.

The second circuit layer 140 may be formed on the upper surface of the metal pillar 120 which is exposed to the outside. Thus, the position where the second circuit layer 140 is to be formed may be identified based on the exposed metal pillar 120. The second circuit layer 140 may have a wider diameter than the metal pillar 120, such that even if the second circuit layer 140 and the metal pillar 120 are misaligned each other, short-circuits may be reduced.

Referring to FIG. 10, in an example, the second circuit layer 140 may be thicker than the first circuit layer 110 to improve signal transmission, reliability, and heat releasing. In another example, the second circuit layer 140 may not be thicker than the first circuit layer 110. The thickness of the second circuit layer 140 may vary depending on the purpose.

Figure 11:
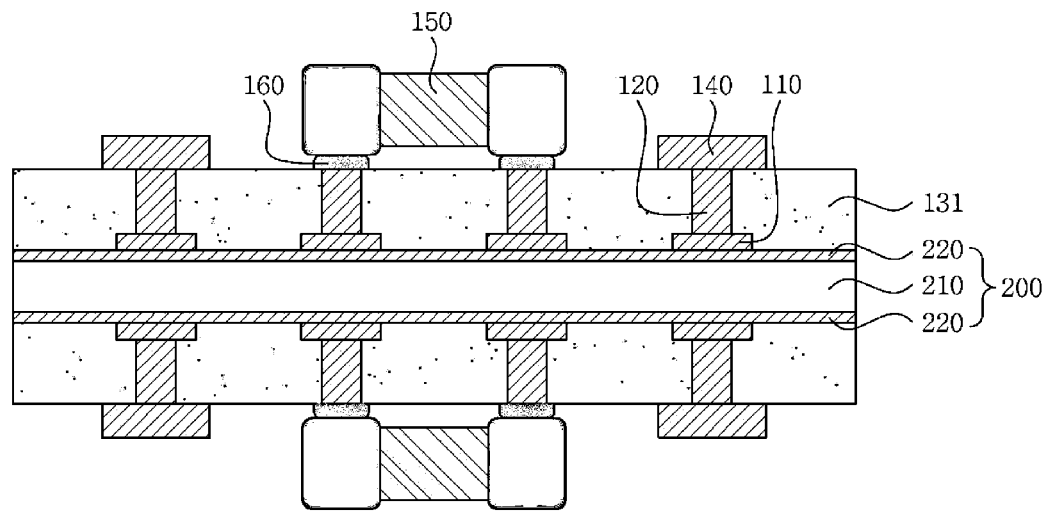

Referring to FIG. 11, a first electronic element 150 may be disposed on the upper part of the metal pillar 120 where the second circuit layer 140 is not formed. Here, since the upper surface of the metal pillar 120 is exposed to the outside, the first electronic element 150 may be arranged at the correct position.

The first electronic element 150 may be a MLCC but it may not be limited thereto. It may be any element, which can be mounted and embedded in a circuit boards.

An adhesive 160 may be formed between the first electronic element 150 and the metal pillar 120. The adhesive 160 may be any one that is used for circuit boards According to an example, the adhesive 160 may be formed from a conductive material. For example, the adhesive 160 may be formed from a solder. Thus, the first electronic element 150 and the metal pillar 120 may be electrically connected by the adhesive 160. When the metal pillar 120 and the first electronic element 150 are to be insulated from each other, the adhesive 160 may be formed of a non-conductive material such as, for example, an epoxy resin, which is used for circuit boards.

According to an example, the adhesive 160 may be formed or not be formed.

Because the metal pillar 120 is exposed, the position where the first electronic element 150 is to be formed can be identified. Thus, a process for forming cavities may not be needed, which further reduces manufacturing cost.

Figure 12:
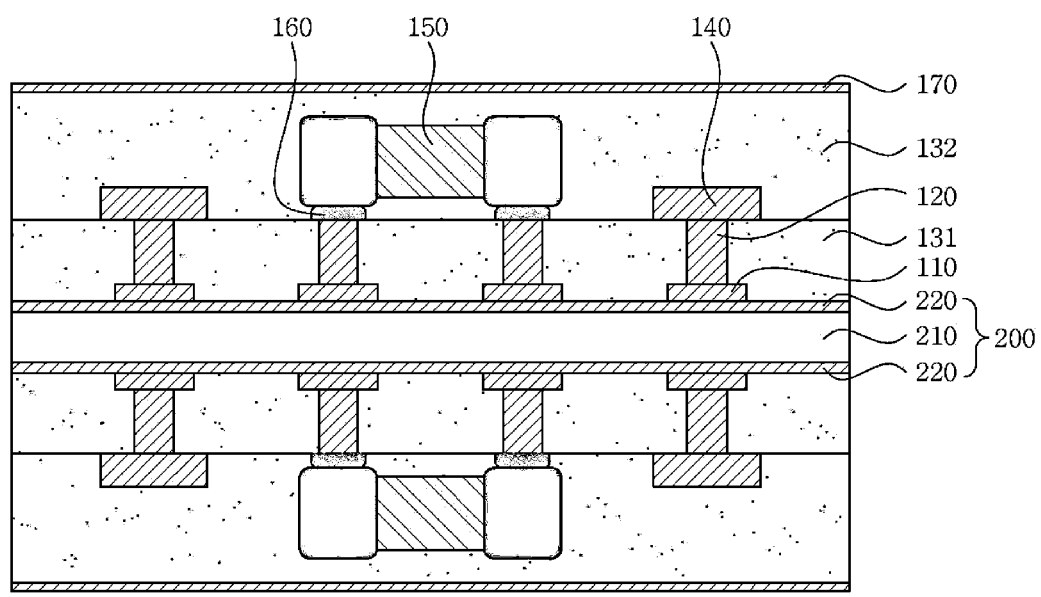

In S160 of FIG. 2, referring to FIG. 12, a second insulating layer embedding the second circuit layer 140 and the first electronic element 150 may be formed.

The second insulating layer 132 may be formed on the upper part of the first insulating layer 131 to embed the second circuit layer 140 and the first electronic element 150.

A metal layer 170 may be formed on the upper surface of the second insulating layer 132. Thus, a single-sided metal laminate including the second insulating layer 132 and the metal layer 170 may be formed on the upper part of the first insulating layer 131.

The second insulating layer 132 may be formed of a composite polymer resin, which is used as an interlayer insulating material. For example, the second insulating layer 132 may be formed of an epoxy-based resin such as, for example, prepreg, ajinomoto build-up film (ABF), FR-4, and bismaleimide triazine (BT). The second insulating layer 132 may be formed of any insulating material known in the field of circuit boards.

According to an example, the metal layer 170 may be formed of copper, or any metal that is used in the field of circuit boards.

A single-sided metal laminate is used to form the second insulating layer 132, but it may not be limited thereto. That is, the second insulating layer 132 may be formed without the metal layer 170. For example, the second insulating layer 132 may be formed by laminating a film on the upper part of the first insulating layer 131 and pressing and heating. The second insulating layer 132 may be also formed by coating in a liquid type on the upper part of the first insulating layer 131.

The method for forming the second insulating layer 132 may not be limited to the above mentioned methods and may be any method known in the art.

Figure 13:
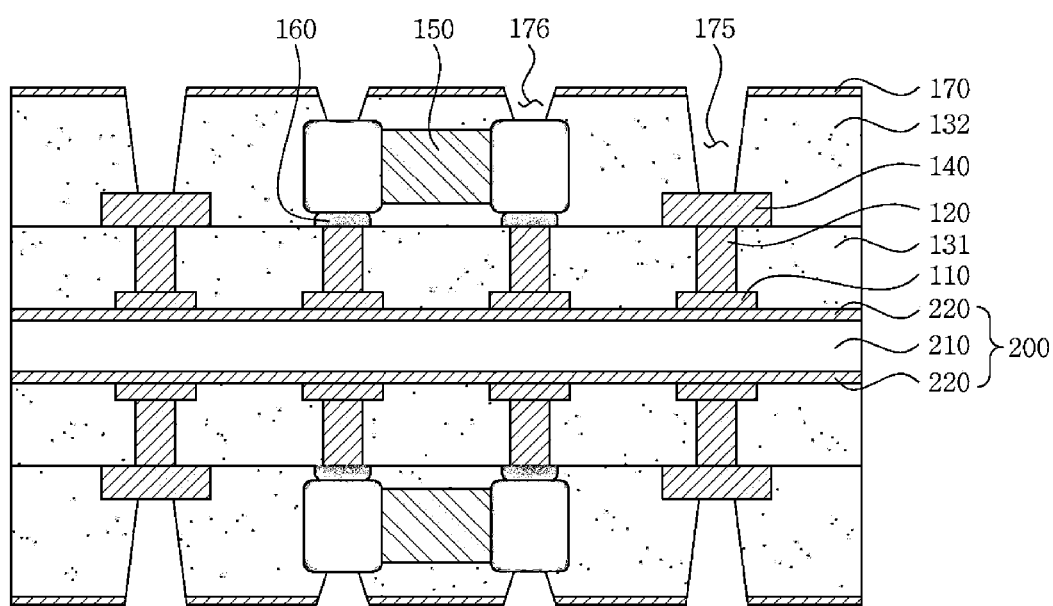
Figure 14:
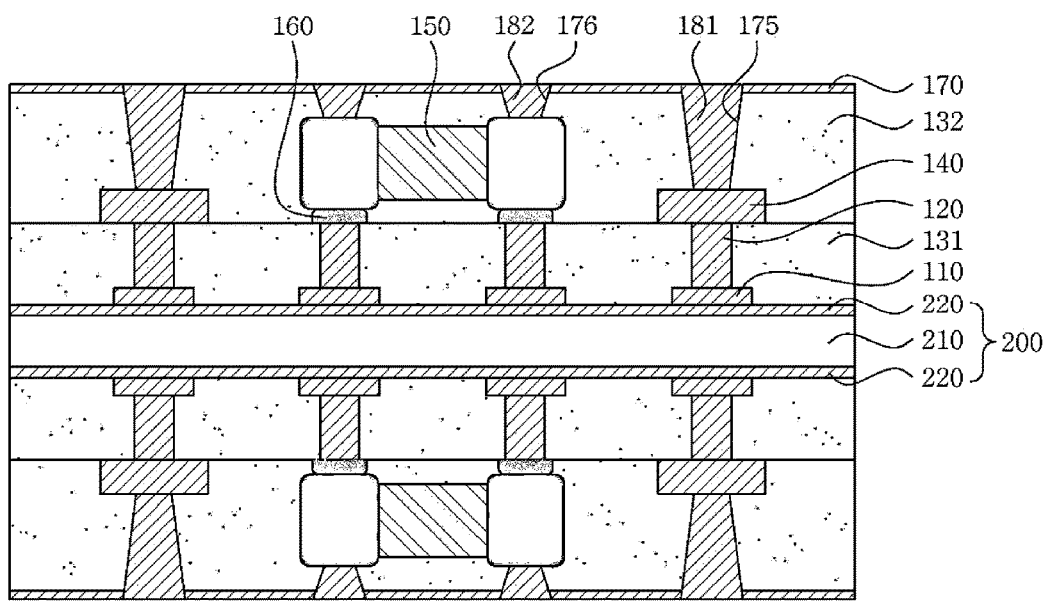

In S170 of FIG. 2, referring to FIG. 13 and FIG. 14, a first via 181 may be formed on the upper part of the second circuit layer 140.

Referring to FIG. 13, a first via hole 175 may be formed in the second insulating layer 132.

The first via hole 175 may be formed on the upper part of the second circuit layer 140 to pass through the second insulating layer 132 and the metal layer 170. Thus, a part of the second circuit layer 140 may be exposed to the outside due to the first via hole 175.

The first via hole 175 may be formed by a laser processing method but the method may not be limited thereto. It may be any method, which is used for forming metal layers or insulating layers for circuit boards. A second via hole 176 may be formed in the second insulating layer 132.

The second via hole 176 may be formed on the upper part of the first electronic element 150 to pass through the second insulating layer 132 and the metal layer 170. Thus, a part of the upper surface of the first electronic element 150 may be exposed to the outside due to the second via hole 176. The exposed first electronic element 150 may be an electrode.

The second via hole 176 may be formed by a laser process method, which is the same as the method to form the first via hole 175. However, the method may not be limited thereto. It may be any method, which is used for forming metal layers or insulating layers for circuit boards.

Referring to FIG. 14, a first via 181 may be formed.

The first via 181 may be formed by filling a conductive material, which is used in the field of circuit boards, into the first via hole 175. For example, the first via 181 may be formed by filling a conductive material, such as, for example, copper.

According to an another example, the first via 181 may be formed by an electro plating method but the method may not be limited thereto, the first via 181 may be formed by any method which can fill a conductive material into the first via hole 175.

The first via 181 may adhere to and be electrically connected with the second circuit layer 140.

A second via 182 may be formed in the second via hole 176. The second via 182 may be formed by filling a conductive material, which is used for circuit boards into the second via hole 176. In another example, the second via 182 may be formed by an electro plating method but the method may not be limited thereto. The second via 182 may be formed by any method that can fill a conductive material into the second via hole 176.

The second via 182 may adhere to and be electrically connected with the first electronic element 150.

The first via 181 may be formed to have a smaller diameter than the second circuit layer 140. Thus, even if the first via 181 and the second circuit layer 140 are misaligned, the probability of short-circuits may be reduced. Since the second via 182 may be formed after identifying the position where the first electronic element 150 is exposed to the outside, it may reduce misalignment.

Because the method for manufacturing an embedded board is able to check patterns of the lower part, which is exposed to the outside when the patterns are formed, conformity between the patterns to be laminated may be improved. The patterns may be the first circuit layer 110, the second circuit layer 140, the metal pillar 120, the first via 181, and the second via 182.

For example, conventionally when a through via is formed, a via hole is processed from the upper part and the lower part of a board at the same time. Here, an alignment defect between the via holes formed from the upper part and the lower part may be caused due to warpage of the board. This may further cause electric shorts.

When the metal pillar 120, the second circuit layer 140, and the first via 181 are formed on first circuit layer 110 which corresponds to the through via, since each pattern formed on the lower part is exposed to the outside, the position to be stacked may be readily identified. In addition, the second circuit layer 140 may be formed to have a greater diameter than the upper surface of the metal pillar 120 and the lower surface of the first via 181. Thus, even if the patterns are misaligned, short-circuits may be prevented or reduced.

Figure 15:
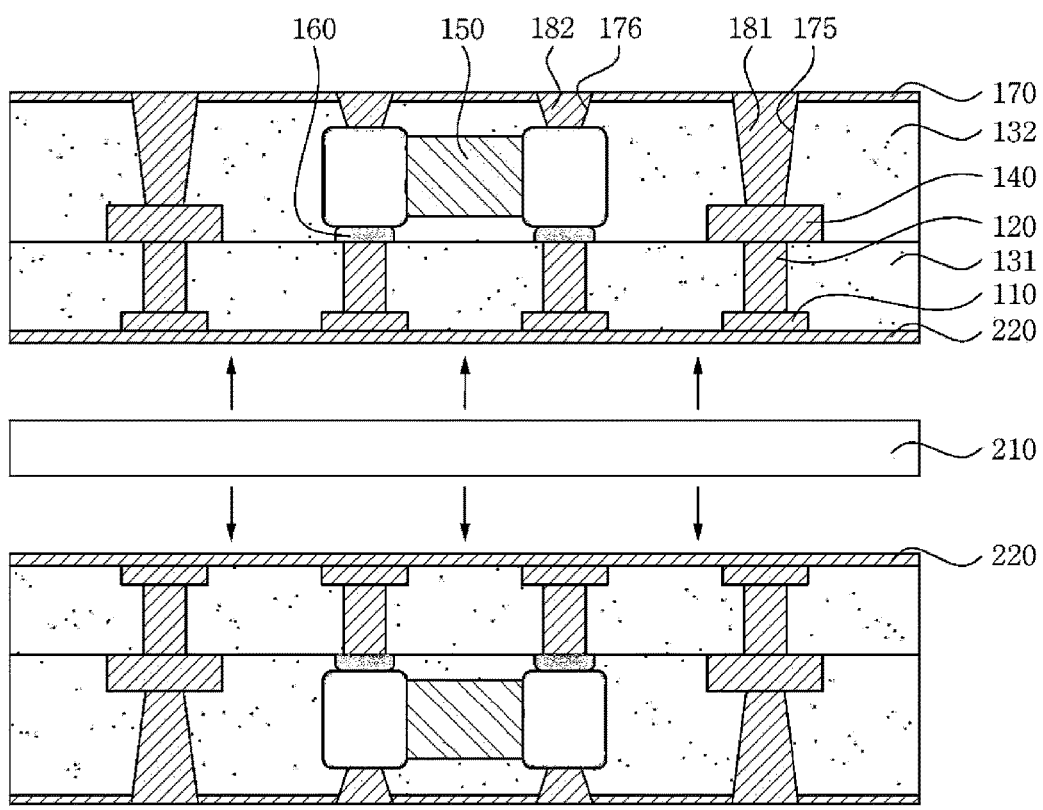
Figure 16:
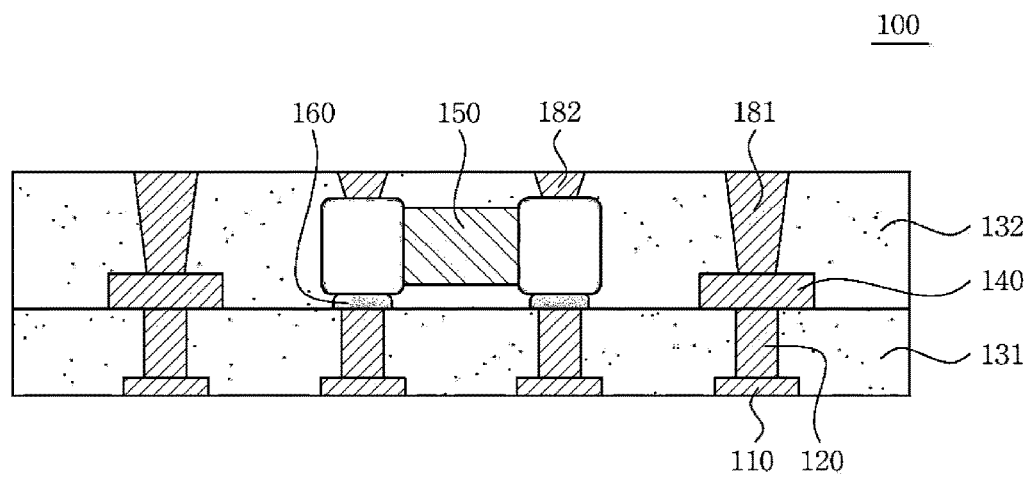

In S180 of FIG. 2, referring to FIG. 15 and FIG. 16, the carrier board 200 may be eliminated.

The carrier core 210 and the carrier metal layer 220 may be separated from each other. Here, the carrier core 210 may be eliminated and the carrier metal layer 220 may be remained on the lower surface of the first insulating layer 131.

Referring to FIG. 16, the carrier metal layer 220 and the metal layer 170 may be eliminated.

The carrier metal layer 220 in FIG. 15 formed on the lower surface of the first insulating layer 131 may be eliminated to expose the first circuit layer 110 to the outside. The metal layer 170 in FIG. 15 formed on the upper surface of the second insulating layer 132 may be also eliminated to expose the first via 181 and the second via 182 to the outside.

The carrier metal layer 220 and metal layer 170 may be eliminated by quick etching, flash etching or polishing, or by any method which is used for eliminating a metal in the field of circuit boards.

Two embedded boards 100 may be formed when the carrier board 200 is eliminated.

Figure 17:
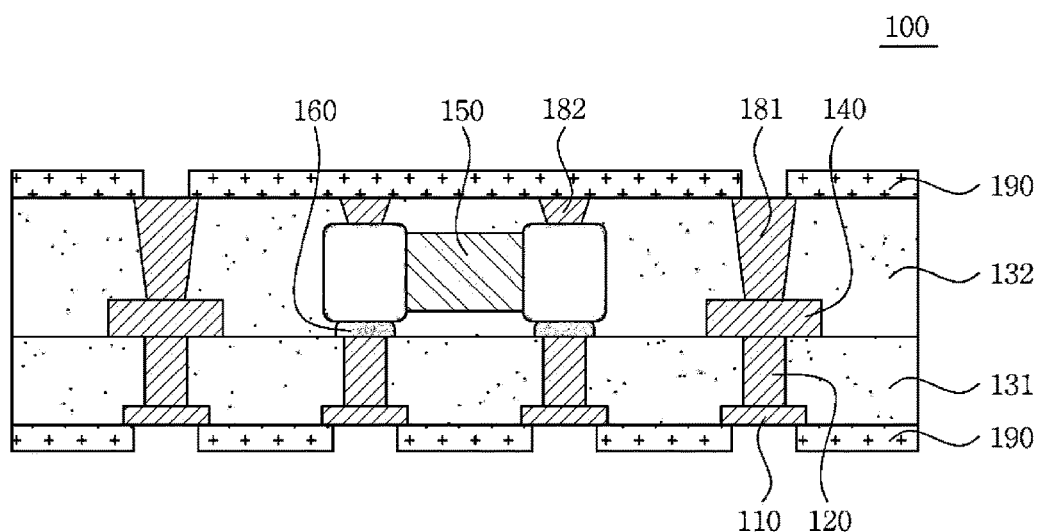

Referring to FIG. 17, a protecting layer 190 may be formed. The protecting layer 190 may be formed on the lower part of the first insulating layer 131 to protect the first circuit layer 110. The protecting layer 190 may be also formed on the upper part of the second insulating layer 132 to protect the first via 181 and the second via 182.

The protecting layer 190 may prevent the solder from coating on the first circuit layer 110, the first via 181, and the second via 182. The protecting layer 190 may also prevent oxidation and corrosion of the first circuit layer 110, the first via 181 and the second via 182.

The protecting layer 190 may be formed to expose the part, which is electrically connected with an external component. For example, when there is a part to be electrically connected with an external component among the first circuit layer 110, the first via 181 and the second via 182, the protecting layer 190 may be formed to expose that part to the outside.

According to an embodiment of the present disclosure, the protecting layer 190 may be formed of a heat resistance covering material, such as, for example a solder resist.

According to an example, the step for forming the protecting layer 190 may be omitted.

According to a method for manufacturing an embedded board, the first circuit layer 110 may be formed to be embedded in the first insulating layer 131, and the first via 181 and the second via 182 may be formed to be embedded in the second insulating layer 132. That is, the embedded board 100 may be formed to have buried patterns. When the protecting layer 190 is formed, the upper surface of the protecting layer 190 formed on the embedded board 100 may have a lower height than the protecting layer formed on a board having protruded patterns. That is, the embedded board 100 may be formed with a thinner thickness than the board having protruded patterns.

Figure 18:
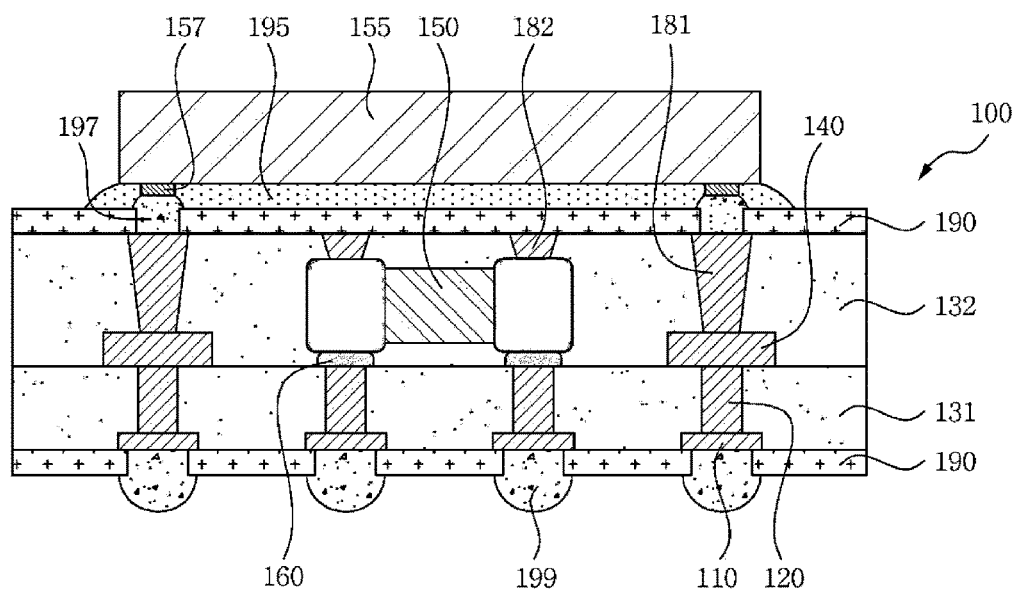
FIG. 18 is a diagram illustrating an example of an embedded board on which an electronic element is mounted.

FIG. 18 is an diagram illustrating an example of an embedded board on which an electronic element is mounted.

According to an example, a second electronic element 155 may be mounted on the upper part of the embedded board 100 in which the first electronic element 150 is mounted. Here, the embedded board 100 is the embedded board 100 in FIG. 1. Thus, detailed explanation of the embedded board 100 will be omitted, and is incorporated herein by reference.

A second electronic element 155 may be formed on the lower part of the second electronic element 155 to be protruded to the outside (the lower part).

According to an embodiment of the present disclosure, the connection pattern 157 may be formed of any conductive material which is used in circuit boards, such as, for example, copper.

When the second electronic element 155 is mounted on the upper part of the embedded board 100, the connection pattern 157 may be located on the upper part of the first via 181. Here, the connection pattern 157 and the first via 181 may be electrically connected by a first external connecting terminal 197, such as, for example, a solder ball. In another example, the connection pattern 157 and the first via 181 may be electrically connected by directly being in contact with each other.

A second external connecting terminal 199 may be formed on the lower part of the first insulating layer 131 of the embedded board 100. The second external connecting terminal 199 may be formed on the lower part of first circuit layer 110, which is exposed to the outside by the protecting layer 190. The second external connecting terminal 199 may be in contact with the first circuit layer 110 to be electrically connected to each other.

The first external connecting terminal 197 and the second external connecting terminal 199 may be electrically connected with the embedded board 100 and the external component. In an example, the first external connecting terminal 197 and the second external connecting terminal 199 may be a solder ball.

In an example illustrated in FIG. 18, it is shown that the connection pattern 157 is formed for the second electronic element 155 to be protruded to the outside, but structure of the second electronic element 155 may not be limited thereto. For example, the connection pattern 157 may be formed inside the second electronic element 155 or may not be formed. Here, an electrode of the second electronic element 155 (not shown) may be directly in contact with the first external connecting terminal 197.

In an example, an underfill resin 195 may be formed between the second electronic element 155 and the embedded board 100. The underfill resin 195 may adhere the second electronic element 155 to the embedded board 100. The underfill resin 195 may also protect the second electronic element 155 and the embedded board 100 from external impact. The underfill resin 195 may be any underfill material which is known in the field of circuit boards.

A gap between the second electronic element 155 and the protecting layer 190 which are mounted on the embedded board 100 may be greater than that on the board having protruded patterns. Since the underfill resin 195 may have greater adhesion with the solder resist which is the protecting layer 190, compare to copper, the underfill resin 195 may adhere more with the protecting layer 190, causing void between the second electronic element 155 and the board when the gap between the second electronic element 155 and the protecting layer 190 is small. However, the embedded board 100 above description may have a greater gap between the protecting layer 190 and the electronic component due to the buried patterns than the board having protruded patterns, such that flowability of the underfill resin 195 may improve. Thus, it may prevent the void caused between the second electronic element 155 and the embedded board 100.

In an example, it has been explained when the second electronic element 155 is formed on the upper part of the embedded board 100. However, the position where the second electronic element 155 is mounted may not be limited thereto. That is, the second electronic element 155 may be mounted at least one of on the upper part and on the lower part of the embedded board 100. Here, the upper part of the embedded board 100 is the upper part of the second insulating layer 132 and the lower part of the embedded board 100 is the lower part of the first insulating layer 131.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF REFERENCE NUMERALS

100: Embedded board
110: First circuit layer

120: Metal pillar
130: Insulating layer
131: First insulating layer
132: Second insulating layer
140: Second circuit layer
150: First electronic element
155: Second electronic element
157: Connection pattern
160: Adhesive
170: Metal layer
175: First via hole
176: Second via hole
181: First via
182: Second via
190: Protecting layer
195: Underfill resin
197: First external connecting terminal
200: Carrier board
210: Carrier core
220: Carrier metal layer
300: Plating resist
310: Plating opening part

What is claimed is:

1. An embedded board comprising:
a first insulating layer;
a first circuit layer formed inside the first insulating layer;
a second circuit layer formed on an upper part of the first circuit layer, and the second circuit layer being disposed on the first insulating layer;
a second insulating layer disposed on a top surface of the first insulating layer, wherein the second circuit layer is disposed in the second insulating layer;
a first electronic element arranged inside the second insulating layer, the first electronic element being spaced apart from the second circuit layer;
a metal pillar formed between the first circuit layer and the second circuit layer or the first electronic element; and
a first via formed on an upper part of the second circuit layer inside the second insulating layer, at least a portion of a top surface of the first via in contact with a protection layer formed on an upper surface of the second insulating layer, and the remainder of the top surface of the first via exposed in an opening of the protection layer,
wherein the top surface of the first insulating layer comprises a polished plane exposing a top of the metal pillar.

2. The embedded board of claim 1, wherein a lower surface of the first circuit layer is exposed to the outside.

3. The embedded board of claim 2, wherein the lower surface of the first circuit layer is on a same line as a lower surface of the first insulating layer.

4. The embedded board of claim 2, wherein the upper surface of the first via is on a same line as an upper surface of the second insulating layer.

5. The embedded board of claim 1, wherein the metal pillar is configured to electrically connect the first circuit layer with either one or both of the second circuit layer or the first electronic element.

6. The embedded board of claim 1, further comprising an adhesive formed between the metal pillar and the first electronic element.

7. The embedded board of claim 6, wherein the adhesive is configured to electrically connect the metal pillar and the first electronic element.

8. The embedded board of claim 1, further comprising a second via formed on an upper part of the first electronic element, the second via located inside the second insulating layer, and the second via being electrically connected with the first electronic element.

9. The embedded board of claim 8, wherein an upper surface of the second via is exposed to the outside.

10. The embedded board of claim 1, further comprising protecting layers formed on a lower surface of the first insulating layer.

11. The embedded board of claim 1, further comprising a second electronic element mounted on at least one of an upper part of the second insulating layer and a lower part of the first insulating layer.

12. The embedded board of claim 11, further comprising an underfill resin formed between the second electronic element and the second insulating layer.

13. The embedded board of claim 1, wherein the metal pillar is aligned with the opening of the protecting layer and an opening of a second protecting layer disposed below the metal pillar, and the first circuit layer is exposed at the opening of the second protecting layer.

* * * * *